(12) United States Patent
Koinuma et al.

(10) Patent No.: US 7,727,686 B2
(45) Date of Patent: Jun. 1, 2010

(54) METHOD OF MAKING LC POLYMER FILM

(75) Inventors: Hideomi Koinuma, Suginami-ku (JP); Kenji Itaka, Yokohama (JP); Keiichirou Arai, Adachi-ku (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 715 days.

(21) Appl. No.: 10/585,204

(22) PCT Filed: Aug. 27, 2004

(86) PCT No.: PCT/JP2004/012378

§ 371 (c)(1),
(2), (4) Date: Jul. 3, 2006

(87) PCT Pub. No.: WO2005/083147

PCT Pub. Date: Sep. 9, 2005

(65) Prior Publication Data

US 2007/0160846 A1 Jul. 12, 2007

(30) Foreign Application Priority Data

Feb. 27, 2004 (JP) .............................. 2004-054035

(51) Int. Cl.
C08F 4/46 (2006.01)
C08J 3/28 (2006.01)
C08J 7/18 (2006.01)
C09K 19/00 (2006.01)
G02F 1/03 (2006.01)

(52) U.S. Cl. ............................ 430/20; 522/165; 522/2; 523/300; 427/457; 427/508; 427/509; 427/521; 252/299.01; 264/405; 264/407; 264/409; 528/308; 528/308.6; 428/1.1

(58) Field of Classification Search ...................... 522/2, 522/156; 523/300; 252/299.01; 427/457, 427/508, 509, 521; 264/405, 407, 409; 430/20; 428/1.1; 528/308, 308.6
See application file for complete search history.

(56) References Cited

U.S. PATENT DOCUMENTS 5,505,985 A * 4/1996 Nakamura et al. ............ 427/66
7,608,371 B2 * 10/2009 Ueno et al. .................. 430/20
2009/0048362 A1 * 2/2009 Ueno et al. .................... 522/2

FOREIGN PATENT DOCUMENTS

JP 07-169567 7/1995

OTHER PUBLICATIONS

Arai et al.Fabrication of Liquid Crystal Polymer Films and Their Passivation Effect for Organic Devices. Jpn. J. Appl. Phys. 44 (2005) pp. 4164-4166.*
Tsuboi et al. Thin Film formation of poly (N-vnylcarbazole) by laser ablation deposition. Journal of Applied Physics, vol. 85, No. 8, Apr. 15, 1999. pp. 4189-4195.*
Itaka et al. Pulsed laser deposition of c* axis oriented pentacene films. Applied Phyics A: Materials Science and Processing, 79, pp. 875-877 (2004).*
Nishio et al. Control of structures of deposited polymer films by ablation laser wvelength: Polyarylonitrile at 308, 248, and 193 nm. Journal of Applied Physics 79 (9), May 1, 1996, pp. 7198-7204.*
Luo et al. Deposition of oriented polymer films for liquid crystal alignment by pulsed laser ablation. Applied Surface Science, 108 (1997) pp. 89-93.*
Arai, Keiichiro et al., "Pulse Laser Taisekiho ni yoru Ekisho Polymer Hakumaku no Sakusei", The Japan Society of Applied Physics, vol. 64. No. 3, p. 1227 Aug. 30, 2003..
Gonzalo, J. et al., "Pulsed laser deposition of liquid crystals", Appl. Phys. Lett., vol. 71, No. 19, pp. 2752-2754, Nov. 1997.
Gonzalo, J. et al., "Liquid crystal films grown by pulsed laser deposition", Applied Surface Science, vol. 138-139, pp. 179-183, 1999.
Arai, Keiichiro et al., "Ekisho Polymer no LD-TOFMS, PLD Ho ni yoru Makutaiseki, Oyobi Maku no Zetsuensei, Device Hogo Tokusei no Hyoka", vol. 51, No. 3, p. 1341, Mar. 28, 2004.
Fukumoto, Hiroki et al., "Combinatorial Physical Vapor Deposition of π-Conjugated Organic Thin Film Libraries", Macromolecular Rapid Communications, vol. 25, pp. 196-203, 2004.

* cited by examiner

Primary Examiner—Sanza L McClendon
(74) Attorney, Agent, or Firm—Oblon, Spivak, McClelland, Maier & Neustadt, L.L.P.

(57) ABSTRACT

To provide a method of making a film of organic material excellent in moisture barrier property and/or oxygen barrier property and also to provide an electronic device excellent in long term stability, in which the film obtained by such film making method is utilized to form a protective film for protecting an electronic device, and particularly an organic electronic device, to avoid deterioration of the performance, which would otherwise be brought about by moisture and oxygen in the atmosphere. The film is formed by depositing and solidifying, on a substrate, an evaporant formed by irradiating a liquid crystal polymer capable of exhibiting an optical anisotropy with pulsed laser.

13 Claims, 3 Drawing Sheets

METHOD OF MAKING LC POLYMER FILM

This application is a 371 of PCT/JP04/12378 filed Aug. 27, 2004.

Field of the Invention

The present invention relates to a film prepared from an evaporant formed by irradiating a liquid crystal polymer (LCP) exhibiting an optically anisotropy with a pulsed laser and also to an electronic device utilizing such film as a protective film. More specifically, the present invention relates to an organic electronic device such as, for example, an organic electroluminescence element (hereinafter referred to as an organic EL element), an organic field effect transistor element (hereinafter referred to as an organic FET element) and an photoelectric conversion element.

The electronic device of the present invention has excellent water and vapor barrier properties, an excellent oxygen barrier property, an excellent electric property, an excellent thermostability, an excellent chemical resistance and an excellent electrical characteristic all derived from the liquid crystal polymer (LCP) without adversely affecting merits such as, for example, lost cost producibility and a light, thin, short and small feature.

Background Art

In recent years, as a result of the advance of research and development conducted to improve the performance, demands for the electronic devices such as, for example, EL elements, FET elements and photoelectric conversion elements all made of an inorganic material and/or an organic material are increasing. See, for example, non-patent document No. 1 entitled "Macromolecular Rapid Communication", vol. 25, pp 196-203 (2004). However, of those electronic devices, the electronic devices utilizing the organic material are susceptible to reduction in performance as a result of quick reaction with moisture and/or oxygen contained in the atmosphere, it has been pointed out that the electronic devices of such kind should be provided with a protective film to avoid deterioration thereof. See, for example, the Japanese Laid-open Patent Publication No. 7-169567.

For the protective film, inorganic materials such as, for example, SiO, SiON, SiN, AlO, AlN, $Al_2O_3$ and DLC (Diamond Like Carbon) have hitherto been employed and, on the other hand, application of organic materials such as, for example, epoxy resin, polyimide resin and polymethyl methacrylate is currently examined. By way of example, the FET element, in which a semiconductor is made of an inorganic material is manufactured by sandwiching the inorganic material with electrodes, followed by sealing the assembly with an epoxy resin. The epoxy resin used therein must contain a substantial amount of filler for the purpose of suppressing penetration and/or residual in the epoxy resin of moisture and/or oxygen contained in the atmosphere and accordingly, it is difficult to make the FET element lightweight, thin, short and small. Also, the semiconductor made of an inorganic material has such a low producibility that requirement to reduce the cost of manufacture thereof is correspondingly limited.

On the other hand, the FET element, in which a semiconductor is made of an organic material can be manufactured at a low cost if the semiconductor is made of the organic material, but since the organic material is more susceptible to deterioration in the presence of moisture and/or oxygen contained in the atmosphere than the currently utilized inorganic material, development of an excellent protective film for protecting the element is desired for.

As a material for protecting the semiconductor of the organic FET element to block off the moisture and/or oxygen contained in the atmosphere, the organic materials referred to previously can be employed, but would not give rises to such merits of reduction in weight and cost as brought about by the use of the organic material. On the other hand, in order to use the organic material for the protective layer, a chemical reaction with the semiconductor and deposition of impurities have to be avoided and, hence, the organic material diluted with a solvent cannot be coated. Also, even if a suitable organic material for the protective film is discovered, the organic material is susceptible to damage. For example, since the organic semiconductor layer is necessarily deteriorated when the sputtering technique is used, an alternative method of forming the protective film uniformly without impairing the organic semiconductor and, at the same time, capable of maintaining the performance thereof is required.

Also, the foregoing situation discussed in connection with the organic FET element can be found even in the case of the organic EL element and the photoelectric conversion element referred to above, so far as the use of the organic material as the protective film is concerned.

DISCLOSURE OF THE INVENTION

In view of the foregoing, the present invention is intended to provide a method of making a film of organic material excellent in moisture barrier property and/or oxygen barrier property and also to provide an electronic device excellent in long term stability, in which the film obtained by such film making method is utilized to form a protective film for protecting an electronic device, and particularly an organic electronic device, to avoid deterioration of the performance, which would otherwise be brought about by moisture and oxygen in the atmosphere.

The present invention is based on the result of a series of studies conducted by the inventors of the present invention to accomplish the foregoing object. Specifically, the inventors of the present invention have found that the film of the present invention, which has an excellent moisture barrier property and/or an oxygen barrier property could be formed when an evaporant formed by irradiating a liquid crystal polymer exhibiting an optically anisotropy with pulsed laser is deposited and solidified on a substrate.

Accordingly, the present invention is featured by including projecting pulsed laser to a target comprised of a liquid crystal polymer exhibiting an optically anisotropy (which polymer is hereinafter referred to as LCP) to evaporate the latter, and depositing and solidifying the resultant evaporant on a surface of a substrate of an electronic device, which is disposed in face-to-face relation with the target.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

BEST MODE FOR CARRYING OUT THE INVENTION

Figure 1:
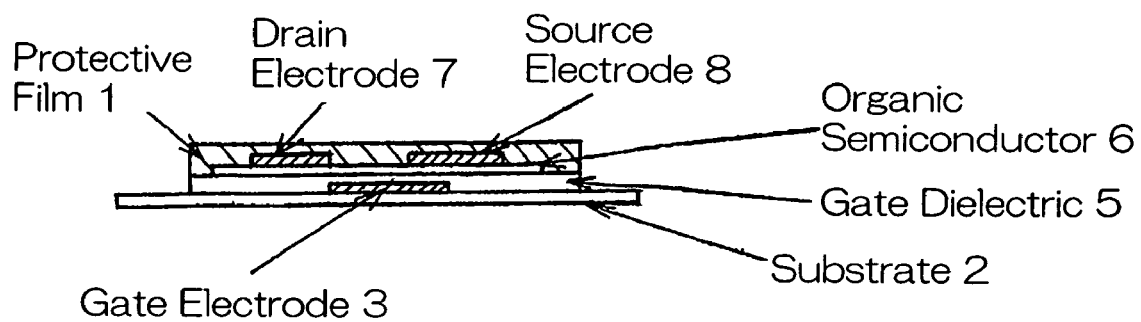
FIG. 1 is a schematic diagram showing a sectional representation of an organic FET element manufactured by a film making method according to the present invention.

Properties of the LCP employed in the practice of the present invention are not specifically limited, but either a lyotropic LCP capable of exhibiting an optically anisotropy in the presence of a solvent or a thermotropic LCP capable of exhibiting an optically anisotropy in melted condition may be employed. However, from the standpoint of the LCP that can be molded to a shape suitable as a target, the use of the thermotropic LCP is preferred. Examples of the lyotropic LCP include aromatic polyamide and polyphenylene-bis-benzothiazole. On the other hand, examples of the thermotropic LCP include known thermotropic liquid crystal polyester and thermotropic liquid crystal polyester amide that can be derived from any compound classified under (1) to (4) below and their derivatives. It is, however, to be noted that in order to obtain a polymer capable of exhibiting an optically anisotropic molten phase, suitable combination of repeating unit is required.

(1) Aromatic or aliphatic dihydroxy compounds, representative examples of which are shown in Table 1 below.

TABLE 1

Chemical formulas of the representative examples
of aromatic or aliphatic dihydroxy compounds

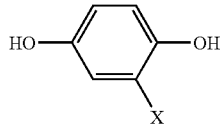

X: hydrogen atom or halogen atom, or
group such as lower alkyl group or
phenyl group

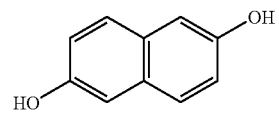

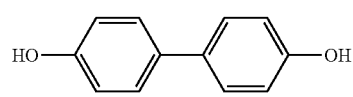

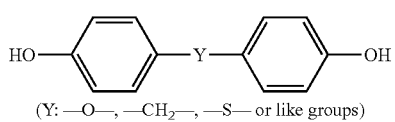

(Y: —O—, —CH$_2$—, —S— or like groups)

TABLE 1-continued

Chemical formulas of the representative examples
of aromatic or aliphatic dihydroxy compounds

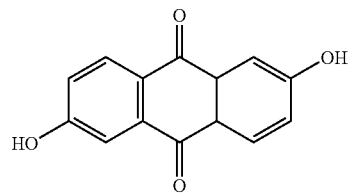

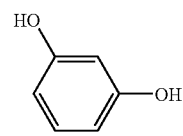

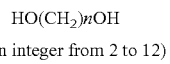

HO(CH$_2$)$n$OH
($n$: an integer from 2 to 12)

(2) Aromatic or aliphatic dicarboxylic acids, representative examples of which are shown in Table 2 below.

TABLE 2

Chemical formulas of the representative examples
of aromatic or aliphatic dicarboxylic acids

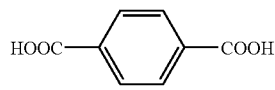

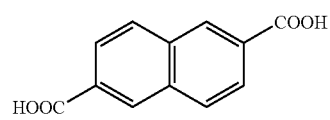

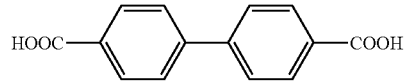

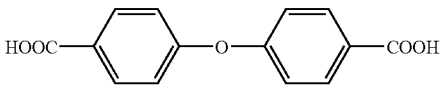

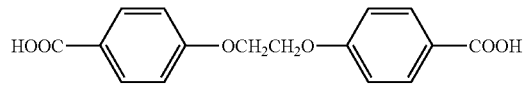

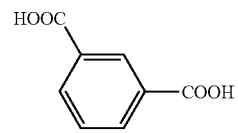

HOOC(CH$_2$)$n$COOH
($n$: an integer from 2 to 12)

(3) Aromatic hydroxycarboxylic acids, representative examples of which are shown in Table 3 below.

TABLE 3

Chemical formulas of the representative examples of aromatic or aliphatic dicarboxylic acids

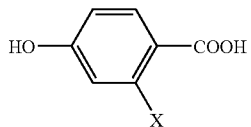

X: hydrogen atom or halogen atom, or group such as lower alkyl group or phenyl group

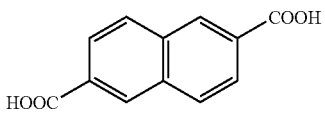

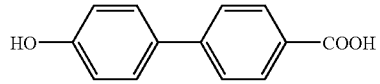

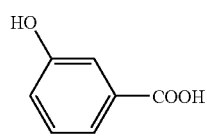

(4) Aromatic diamines, aromatic hydroxyamines or aromatic aminocarboxylic acids, representative examples of which are shown in Table 4 below.

TABLE 4

Chemical formulas of representative examples aromatic diamines, aromatic hydroxyamines or aromatic aminocarboxylic acids

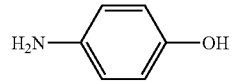

Representative examples of the thermotropic LCP prepared from any of those starting material compounds include copolymers having such structural units as indicated in Table 5 below.

TABLE 5

Examples of Thermoplastic Liquid Crystal Polymers

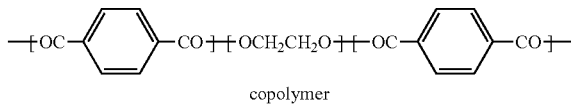
copolymer

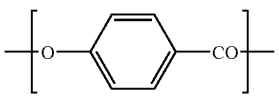

TABLE 5-continued

Examples of Thermoplastic Liquid Crystal Polymers

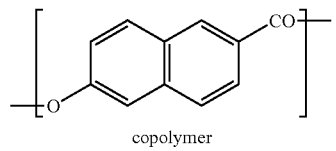
copolymer

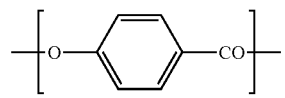

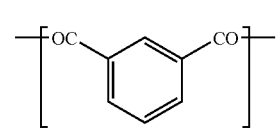

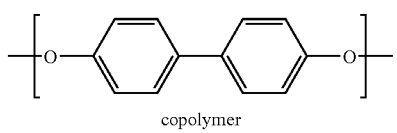
copolymer

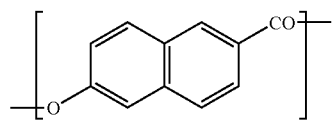

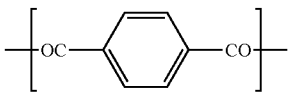

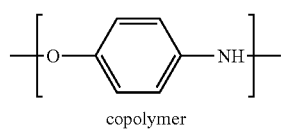
copolymer

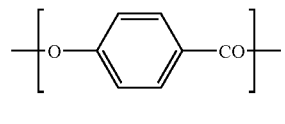

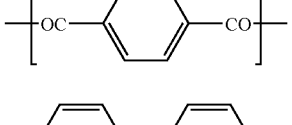

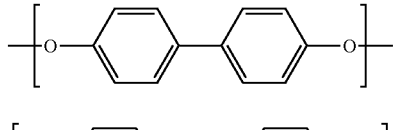
copolymer

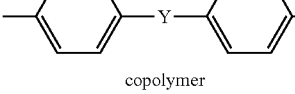

(Y: —O—, —CH$_2$—, —S— or like group

Also, the thermotropic LCP that can be employed in the practice of the present invention is preferably of a kind having a melting point within the range of about 200 to about 400° C. and more preferably within the range of about 250 to about 350° C. as this melting point facilitates formation of a film of thermotropic LCP on the substrate.

In order for it to be used as a target in an equipment having a high productivity, since the thermotropic LCP facilitates replacement of the target and allows continuous supply of the target, the thermotropic LCP is preferably in the form of a film and more preferably in the form of an elongated film.

The film of thermotropic LCP that can be used as a target in the practice of the present invention can be obtained by means of an extrusion molding of the thermotropic LCP. Although any arbitrarily chosen extrusion molding method is employed for this purpose, the T-die film forming and stretching method, the laminate stretching method, the inflation method and others all well known to those skilled in the art can also be employed. Particularly with the laminate stretching method and the inflation method, stresses can be applied not only in a direction of the mechanical axis (hereinafter referred to as MD direction) of the film, but also in a direction (hereinafter referred to as the TD direction) perpendicular to the MD direction and, therefore, the laminate stretching method and the inflation method can be suitably employed to eventually manufacture the film having balanced mechanical and thermal properties in both of the MD and TD directions.

The method of making the film of LCP according to the present invention is preferably carried out using a pulsed laser irradiating apparatus capable of generating a specific wavelength and energies under the vacuum atmosphere of $10^{-1}$ Torr or smaller. If the degree of vacuum departs from this range, the evaporant will not deposit and solidify.

The wavelength of the pulsed laser that can be employed in the practice of the present invention is preferably within the range of 200 to 1,200 nm. If it depart from this range, not only is the speed of deposition of the evaporant low, but also the eventually formed film will lack a sufficient gas barrier property and an electric insulation performance. For the wavelength at which the LCP can be efficiently evaporated, 354~355 nm, 532 nm and 1064 nm in the case of the YAG laser, 248 nm in the case of the KrF laser, or 193 nm in the case of the ArF laser can be enumerated.

The pulsed laser that can be employed in the practice of the present invention is preferably of a type capable of generating energies within the range of 0.1 to 3.0 J/cm². If the laser energy departs from this range, cabonization will be so accelerated that no film can be effectively formed and, if not impossible, the resultant film will lack a sufficient gas barrier property and a sufficient electric insulation performance. More preferably, the energy generated by the pulse laser is within the range of 0.1 to 2.0 J/cm².

For the substrate on which the evaporant formed as a result of irradiation with the pulsed laser is deposited and solidified, any substrate can be employed. By way of example, any material of various shape such as, for example, sheet, film, plate, tube, fiber, cloth or product of heteromorphic shape can be used as a substrate. Of them, the use of a material having a flat shape such as, for example, sheet-like, film-like or plate-like material is preferred because a uniform film can easily be formed. Also, material forming the substrate is not also specifically limited to a particular one and any of polymers such as, for example, polyamide imide, polyether imide, polyimide, LCP, polyether ketone, polyether ether ketone and polyphenylene ether; metals such as, for example, gold, silver, copper, aluminum and nickel; paper, glass, ceramics, inorganic semiconductor and organic semiconductor as will be described later can be conveniently employed.

When the evaporant formed by irradiation with the pulsed laser is deposited and solidified on the surface of the substrate, the substrate may have its surface held at any suitable temperature. Although the temperature of the surface of the substrate may be equal to room temperatures, it is preferably set at a temperature as low as possible.

With the film making method of the present invention, the film made of LCP can be formed on the substrate of a kind discussed above, thereby forming a laminate including the substrate and the LCP film. The laminate so obtained can be used in any of suitable applications, but the use of the laminate in such applications where the such excellent properties of the LCP as gas barrier property and/or electric insulation performance can be efficiently utilized, for example, electronic devices such as, for example, organic FET element, organic EL element and photoelectric conversion element.

The film thickness of the film formed by the film making method of the present invention is not always limited to a particular value, but from the standpoint of the gas barrier property and the electric insulation performance, the film thickness is preferably not smaller than 30 nm. In particular, the film having such a film thickness can exhibit an excellent performance as a protective layer for the electronic device. Where the electronic device is either the EL element or the photoelectric conversion element and the film formed by the film making method of the present invention is desired to be formed on a light emitting surface of the EL element or the light receiving surface of the photoelectric conversion element, the film thickness has to be determined in consideration with the light transmittance as well.

With the film making method of the present invention, the extremely thin film having a film thickness of, for example, smaller than 1 μm can be easily formed. Such an extremely thin film of LCP has hitherto been difficult to make with the conventionally known methods.

As an example of the electronic device, an organic FET element is shown in FIG. 1 in a sectional representation. This FET element can be made by, with the use of a laser molecular beam epitaxy apparatus, depositing a gate electrode 3, a gate dielectrics 5, an organic semiconductor 6, a drain electrode 7 and a source electrode 8 on a substrate 2 such as, for example, a sapphire substrate, the resultant assembly of which is then covered with a protective film 1 of LCP formed by the method of the present invention.

Examples of material for the gate electrode 3 of the organic FET element, which can be employed in the practice of the present invention, includes metals such as, for example, aluminum and gold, and a doped silicon. Those material should be necessarily chosen in consideration of the work function of the semiconductor used and the method of operating the FET element.

Material for the gate dielectric layer 5 of the organic FET element, which can be employed in the practice of the present invention, includes, for example, oxide, nitride, sulfide or organic material, such as aluminum oxide, hafnium oxide, silicon nitride and dielectric polymer, and is feasible if the use of it can minimize a leak current and can exhibit a high withstand electric field and a high dielectric constant as the electric field can easily be applied. However, the particular material should be selected in consideration of the intended output and, therefore, it may not be always limited to the particular ones enumerated above.

Material that can be used as the organic semiconductor 6 of the organic FET element includes an organic material that can exhibit a field effect. In particular, an acene type π conjugated organic material such as, for example, pentacene, tetracene or rubrene, phthalocyanine and fullerene (C60) are feasible because of the mobility, but the particular material should be selected in consideration of the intended output and, therefore, it may not be always limited to the particular ones enumerated above.

Material that can be used as the drain electrode 7 and the source electrode 8 both used in of the organic FET element includes, for example, gold, silver, aluminum, magnesium, an alloy of magnesium and silver and is feasible if it have a high electroconductivity and exhibits a good consistency of the work function with the organic material. However, the particular material should be selected in consideration with the intended output and, therefore, it may not be always limited to the particular ones enumerated above.

Figure 2:
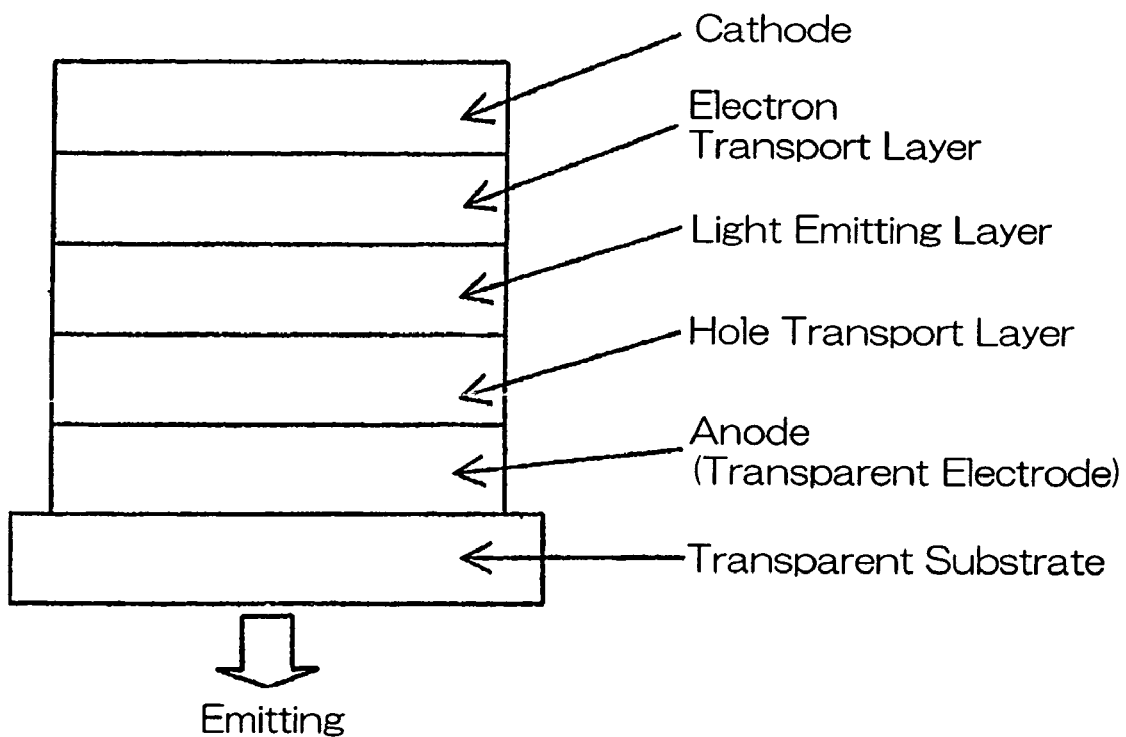
FIG. 2 is a schematic diagram showing a sectional representation of the conventional organic EL element.

As another example of the electronic device, the organic EL element is shown in FIG. 2 in a sectional representation. What is shown in this figure is the conventional organic EL element, in which the transparent substrate such as a glass plate is deposited with an anode made of ITO (Indium Tin Oxide), a hole transport layer, a light emitting layer, an electron transport layer if required, and a cathode in this specified order. The hole transport layer, the light emitting layer and the electron transport layer are prepared from an organic material of a low molecular and/or high molecular and are formed by a process, in which the molecules sublimated under vacuum are deposited or a method in which the material is dissolved in a solvent and is then coated.

In this example, where a flexible polymer film such as, for example, PET film is used as a transparent substrate of the organic EL element, the resultant organic EL element can have light-weight, portable, storable and inexpensive features as compared with that utilizing the glass substrate. However, the highly transparent flexible polymer film is generally considered having a low moisture permeability and a low gas barrier property, the characteristic of the organic EL element is open to deterioration in the presence of moisture and oxygen contained in the atmosphere. Attention is called to the non-patent document No. 1 previously referred to for the details of the structure of the organic EL element.

Figure 3:
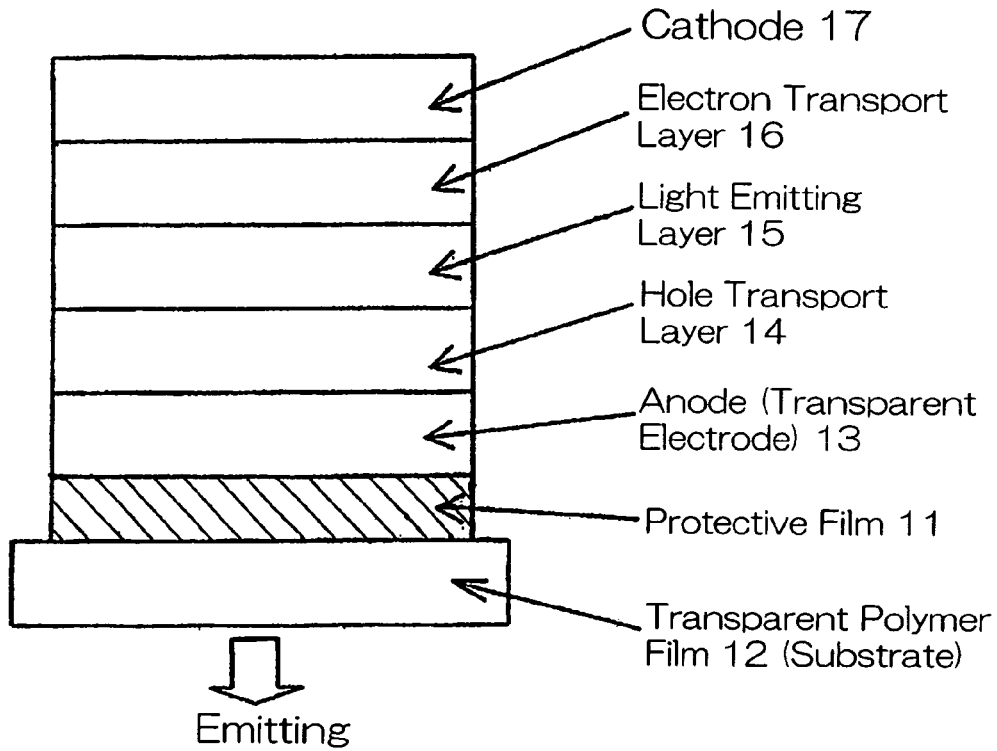
FIG. 3 is a schematic diagram showing a sectional representation of the organic EL element manufactured by the film making method according to the present invention.
Figure 4:
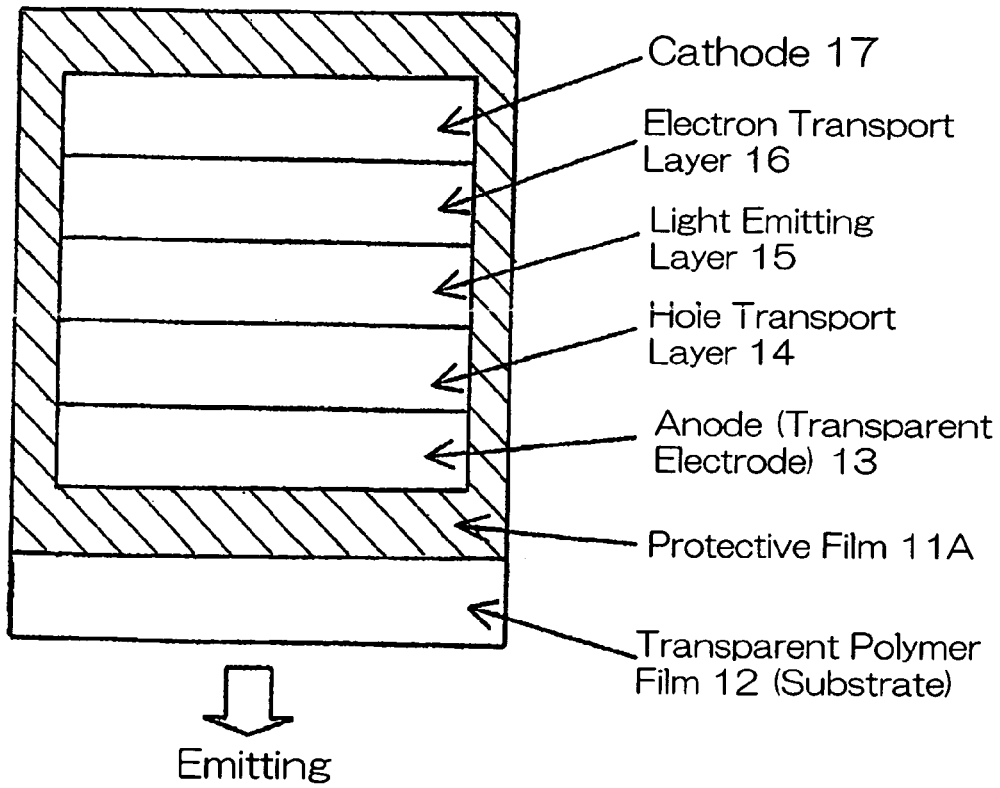
FIG. 4 is a schematic diagram showing a sectional representation of the EL element manufactured by the film making method according to the present invention.

An example of the structure of the organic EL element, in which a film made of LCP in accordance with the film making method of the present invention is utilized as a protective layer, is shown in FIGS. 3 and 4 in a sectional representation. The protective film overlaid on the light emitting surface of the organic EL element must have a practically sufficient light transmittance and, in order for the LCP to be used for that purpose, the protective film must also have a film thickness as small as possible. While any known conventional film making method has been difficult to manufacture such a thin LCP film, the film making method of the present invention makes it possible to provide an extremely thin PCT film having a film thickness of, for example, smaller than 1 μm.

The organic EL element of the structure shown in FIG. 3 can be obtained when an LCP film (protective film) 11 is first formed on a transparent polymer (substrate) 12 by the film making method of the present invention, followed by sequential deposition of the anode 13, the hole transport layer 14, the light emitting layer 15, the electron transport layer 16 and finally the cathode 17 in a manner similar to that used to form the conventional organic EL element of the structure shown in FIG. 2.

Also, such an organic EL element as shown in FIG. 4 can be obtained, when using the film making method of the present invention, the LCP film (protective film) 11A is formed so as to cover, in its entirety, the organic EL element of the structure shown in FIG. 3.

Furthermore, as an electronic device having a similar structure, the photoelectric conversion element, in which an electrode layer, a photoelectric converting layer and so on are formed on a substrate, is well known in the art and, in this electronic device, the LCP film (protective film) may be formed on a surface thereof with the use of the film making method of the present invention.

EXAMPLES

Hereinafter, the present invention will be demonstrated by way of some examples that are not intended to limit the present invention, but are only for the purpose of illustration. In those examples, the protective characteristic and the insulation performance of the protective film formed in accordance with the film making method of the present invention were measured in the following manner:

(a) Protective Characteristic:

With respect to organic FET elements prepared, each of those elements was, immediately after the preparation thereof, allowed to stand for 9 days within a vacuum apparatus having a field-effect mobility (A) and the relative humidity of 60%, and followed by measurement of the field-effect mobility (B). Using the following equation (1), the protective characteristic was evaluated. It is to be noted that the field-effect mobility was determined from a curve $V_G$-$I_D$ within the saturation region, using the following equation (2).

$$\text{Protective Characteristic (unit: \%)} = (B/A) \times 100 \quad (1)$$

$$I_{D,sat} = [W \cdot C_i \cdot \mu_{FE}(V_G - V_T)]/2L \quad (2)$$

Wherein $I_{D,sat}$ represents the drain current within the saturation region, W represents the channel width, L represents the channel length, $C_i$ represents the capacitance per area of the dielectric layer, $\mu_{FE}$ represents the field-effect mobility, $V_G$ represents the gate voltage, and $V_T$ represents the threshold voltage.

(b) Insulation Characteristic

Figure 5:
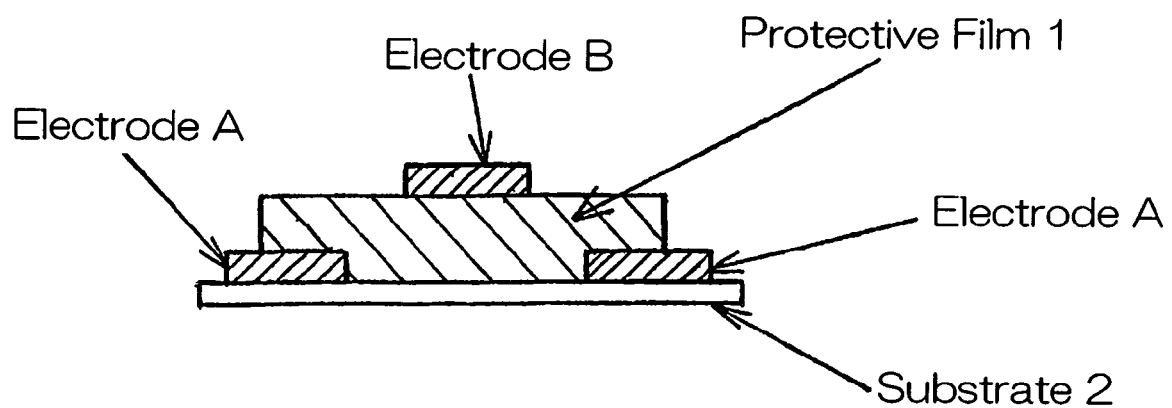
FIG. 5 is a schematic diagram showing a sectional representation of a sample used to measure the insulation characteristic of a protective film formed by the film making method according to the present invention.

As shown in FIG. 5, a sample was prepared, in which an insulating substrate 2 made of sapphire was sequentially deposited with an electrode A of gold, a protective film 1 formed by the film making method of the present invention, and an electrode B of gold in this specific order, and followed by measurement of a breakdown voltage between the electrodes A and B.

Reference Example 1

A thermotropic LCP prepared from a copolymer of p-hydroxybenzoic acid and 6-hydroxy-2-naphthoic acid and having a melting point of 280° C., which was used as a target for the pulsed laser, was extruded in a molten state at a discharge quantity of 20 kg/hr. to inflate at a transverse draw ratio of 4.77 and a longitudinal draw ratio of 2.09 to form a LCP film having a film thickness of 50 μm.

Reference Example 2

A thermotropic LCP prepared from a copolymer of p-hydroxybenzoic acid, terephthalic acid, isophthalic acid and biphenol and having a melting point of 340° C, which was used as a target for the pulsed laser, was extruded in a molten state at a discharge quantity of 20 kg/hr. to inflate at a transverse draw ratio of 3.56 and a longitudinal draw ratio of 2.81 to form a LCP film having a film thickness of 50 μm.

Reference 3

An organic FET element was prepared, in which a sapphire substrate of 1,800 Å in thickness was sequentially deposited with a gate electrode of 300 Å in thickness made of aluminum by the use of a vapor deposition technique, a gate dielectric layer made of an aluminum oxide of 2,000 Å in thickness by the use of a sputtering technique, an organic semiconductor layer of 500 Å in thickness made of pentacene by the use of a laser molecular beam epitaxy technique, a drain electrode of 300 Å in thickness and made of gold, and a source electrode in thickness of 100 Å and made of nickel. The latter two are formed by the use of a vapor deposition technique.

Example 1

Using the thermotropic LCP film obtained under Reference Example 1 as a target, a sample of a structure shown in FIG. 5, which is for use in evaluation of the insulation characteristic, was prepared in which a protective film of 700 Å in film thickness was formed by irradiating the target with KrF pulsed laser, having a wavelength of 248 nm and an energy density of 0.56 J/cm$^2$, under the vacuum atmosphere of $10^{-7}$ Torr.

On the other hand, using the organic FET element obtained under Reference 3, but having no protective film, the organic FET was treated in a manner similar to that described above to form a protective film of 700 Å on a surface thereof, with the resultant organic FET element representing such a structure as shown in FIG. 1.

The insulation characteristic of the sample for use in evaluation of the insulation characteristic so obtained and the protective characteristic of the organic FET element are shown in Table 6 below.

Example 2

Using the thermotropic LCP film obtained under Reference Example 1 as a target, a sample of a structure shown in FIG. 5, which is for use in evaluation of the insulation characteristic, was prepared in which a protective film of 700 Å in film thickness was formed by irradiating the target with KrF pulsed laser, having a wavelength of 248 nm and an energy density of 0.84 J/cm$^2$, under the vacuum atmosphere of $10^{-7}$ Torr.

On the other hand, using the organic FET element obtained under Reference 3, but having no protective film, the organic FET was treated in a manner similar to that described above to form a protective film of 700 Å on a surface thereof, with the resultant organic FET element representing such a structure as shown in FIG. 1.

The insulation characteristic of the sample for use in evaluation of the insulation characteristic so obtained and the protective characteristic of the organic FET element are shown in Table 6 below.

Example 3

Using the thermotropic LCP film obtained under Reference Example 1 as a target, a sample of a structure shown in FIG. 5, which is for use in evaluation of the insulation characteristic, was prepared in which a protective film of 1,100 Å in film thickness was formed by irradiating the target with KrF pulsed laser, having a wavelength of 248 nm and an energy density of 0.56 J/cm$^2$, under the vacuum atmosphere of $10^{-7}$ Torr.

On the other hand, using the organic FET element obtained under Reference 3, but having no protective film, the organic FET was treated in a manner similar to that described above to form a protective film of 1,100 Å on a surface thereof, with the resultant organic FET element representing such a structure as shown in FIG. 1.

The insulation characteristic of the sample for use in evaluation of the insulation characteristic so obtained and the protective characteristic of the organic FET element are shown in Table 6 below.

Example 4

Except that the thermotropic LCP film obtained under Reference Example 2 was used as a target, a sample of a structure, shown in FIG. 5, which is for use in evaluation of the insulation characteristic, and an organic FET element of a structure shown in FIG. 1 were prepared, in which a protective film of 700 Å in film thickness was formed in a manner similar to that under Example 1.

The insulation characteristic of the sample for use in evaluation of the insulation characteristic so obtained and the protective characteristic of the organic FET element are shown in Table 6 below.

Example 5

Except that the Nd/YAG laser having a wavelength of 532 nm and an energy density of 0.133 J/cm$^2$, a sample of a structure, shown in FIG. 5, which is for use in evaluation of the insulation characteristic, and an organic FET element of a structure shown in FIG. 1 were prepared, in which a protective film of 700 Å in film thickness was formed in a manner similar to that under embodiment 1.

The insulation characteristic of the sample for use in evaluation of the insulation characteristic so obtained and the protective characteristic of the organic FET element are shown in Table 6 below.

Comparative Example 1

Using the organic FET element obtained under Reference 3, but having no protective film, the protective characteristic thereof was evaluated, the result of which is shown in Table 6.

TABLE 6

|  | Breakdown Voltage (MV/cm) | Protective Characteristic (%) |
|---|---|---|
| Example 1 | 1.4 | 88 |
| Example 2 | 0.6 | 70 |
| Example 3 | 1.4 | 92 |
| Example 4 | 0.6 | 88 |
| Example 5 | 0.8 | 71 |
| Comp. Ex. 1 | not evaluated | not higher than 1 |

Example 6

Using the thermotropic LCP film obtained under Reference 1 as a target, a protective film of 700 Å in film thickness was formed on a substrate of 100 μm made of polyethylene terephthalate by irradiating the target with KrF pulsed laser, having a wavelength of 248 nm and an energy density of 0.56 J/cm$^2$ under the vacuum atmosphere of $10^{-7}$ Torr. Thereafter, an ITO electrode of 700 Å in thickness, a TPD layer of 50 nm in thickness, an Alq3 (Tris-(8-hydroxyquinolate)-aluminum) layer of 60 nm in thickness, and Mg:Ag electrode of 50 nm in thickness were successively formed and, further, an organic EL element of a structure similar to that shown in FIG. 4, but having no electron transport layer, was prepared by forming a protective film of 700 Å which, using the thermotropic LCP film under Reference 1 as a target, was formed by irradiating it with KrF pulsed laser, having a wavelength of 248 nm and an energy density of 0.56 J/cm$^2$, under the vacuum atmosphere of $10^{-7}$ Torr.

From the foregoing description, it has now become clear that not only can the LCP film excellent in moisture barrier property and/or oxygen barrier property be manufactured, but when such LCP film is formed as a protective film for electronic devices and, particularly organic electronic devices, the electronic devices excellent in long term stability with minimized deterioration in performance thereof, which would be otherwise brought about by moisture and oxygen contained in the atmosphere, can be manufactured.

What is claimed is:

1. A film making method comprising:
   forming a liquid crystal polymer evaporant by irradiating a thermotropic liquid crystal polymer capable of exhibiting optical anisotropy and having a melting point of 250° C. to 350° C. with a pulsed laser to evaporate the liquid crystal polymer, and
   depositing and solidifying the evaporant on a surface to form a film of the thermotropic liquid crystal polymer on the surface.

2. A film formed by the method of claim 1.

3. A laminate comprising the film recited in claim 2 on a surface.

4. An electronic device comprising the film recited in claim 2 as a protective film.

5. The electronic device as claimed in claim 4, wherein the electronic device is an organic electroluminescent element.

6. The electronic device as claimed in claim 4, wherein the electronic device is an organic field-effect transistor element.

7. The method of claim 1, wherein said surface is a surface of an electronic device.

8. The method as claimed in claim 7, wherein the electronic device is an organic electroluminescent element.

9. The method as claimed in claim 7, wherein the electronic device is an organic field-effect transistor element.

10. The method of claim 1, wherein the thickness of the film of the thermotropic liquid crystal polymer on the surface is less than 1 μm.

11. The method of claim 10, wherein the thickness of the film of the thermotropic liquid crystal polymer on the surface is not less than 30 nm.

12. The method of claim 1, wherein the thermotropic liquid crystal polymer irradiated with a pulsed laser is in the form of a film, and is irradiated at a wavelength of 200-1200 nm with a pulsed laser that generates energies within the range of 0.1 to 3.0 J/cm$^2$.

13. The method of claim 11, wherein the thermotropic liquid crystal polymer irradiated with a pulsed laser is in the form of a film, and is irradiated at a wavelength of 200-1200 nm with a pulsed laser that generates energies within the range of 0.1 to 3.0 J/cm$^2$.

* * * * *